United States Patent
Mao et al.

(10) Patent No.: US 9,799,699 B2
(45) Date of Patent: Oct. 24, 2017

(54) HIGH NEAR INFRARED SENSITIVITY IMAGE SENSOR

(71) Applicant: OMNIVISION TECHNOLOGIES, INC., Santa Clara, CA (US)

(72) Inventors: Duli Mao, Sunnyvale, CA (US);
Vincent Venezia, Los Gatos, CA (US);
Gang Chen, San Jose, CA (US);
Dajiang Yang, San Jose, CA (US);
Dyson H. Tai, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 14/494,960

(22) Filed: Sep. 24, 2014

(65) Prior Publication Data
US 2016/0086999 A1    Mar. 24, 2016

(51) Int. Cl.
*H01L 21/00*    (2006.01)
*H01L 27/146*    (2006.01)

(52) U.S. Cl.
CPC .... *H01L 27/14649* (2013.01); *H01L 27/1463* (2013.01); *H01L 27/14629* (2013.01); *H01L 27/14685* (2013.01); *H01L 27/14689* (2013.01); *H01L 27/14621* (2013.01); *H01L 27/14627* (2013.01)

(58) Field of Classification Search
CPC ........... H01L 27/1463; H01L 27/14629; H01L 27/1462; H01L 27/14683; H01L 27/14685
USPC ........................................................ 438/459
See application file for complete search history.

(56) References Cited

U.S. PATENT DOCUMENTS

| 5,179,284 | A | * | 1/1993 | Kingsley | ................. B29C 51/16 250/367 |
| 8,008,695 | B2 | | 8/2011 | Rhodes et al. | |
| 8,232,133 | B2 | | 7/2012 | Rhodes et al. | |
| 8,519,319 | B2 | | 8/2013 | Toda et al. | |
| 2005/0040316 | A1 | * | 2/2005 | Holm | ................ H01L 27/14601 250/208.1 |

(Continued)

OTHER PUBLICATIONS

T. Doi et al., "Advances in CMP/Polishing Technologies for the Manufacture of Electronic Devices", Elsevier 2012, p. 72.*

(Continued)

*Primary Examiner* — Cuong Q Nguyen
*Assistant Examiner* — Peter M Albrecht
(74) *Attorney, Agent, or Firm* — Christensen O'Connor Johnson Kindness PLLC

(57) ABSTRACT

An image sensor includes a plurality of photodiodes disposed proximate to a frontside of a first semiconductor layer to accumulate image charge in response to light directed into the frontside of the first semiconductor layer. A plurality of pinning wells is disposed in the first semiconductor layer. The pinning wells separate individual photodiodes included in the plurality of photodiodes. A plurality of dielectric layers is disposed proximate to a backside of the first semiconductor layer. The dielectric layers are tuned such that light having a wavelength substantially equal to a first wavelength included in the light directed into the frontside of the first semiconductor layer is reflected from the dielectric layers back to a respective one of the plurality of photodiodes disposed proximate to the frontside of the first semiconductor layer.

10 Claims, 4 Drawing Sheets

(56) References Cited

U.S. PATENT DOCUMENTS

| | | | |
|---|---|---|---|
| 2007/0001100 A1* | 1/2007 | Hsu | H01L 27/14625 250/214.1 |
| 2010/0084692 A1* | 4/2010 | Mao | H01L 27/1463 257/258 |
| 2010/0243868 A1* | 9/2010 | Liu | H01L 27/1462 250/216 |
| 2012/0068289 A1* | 3/2012 | Alie | H01L 27/1463 257/432 |
| 2012/0248560 A1* | 10/2012 | Lee | H01L 27/1464 257/432 |
| 2013/0037900 A1* | 2/2013 | Abe | H01L 27/14603 257/431 |
| 2014/0078310 A1* | 3/2014 | Velichko | H04N 5/33 348/164 |
| 2014/0117203 A1* | 5/2014 | Lin | H01L 27/14629 250/208.1 |
| 2014/0138785 A1* | 5/2014 | Pralle | H01L 27/14627 257/432 |
| 2014/0160335 A1* | 6/2014 | Shimotsusa | H01L 27/1463 348/311 |
| 2015/0228689 A1* | 8/2015 | Lenchenkov | H01L 27/14649 257/432 |
| 2015/0325616 A1* | 11/2015 | Huang | H01L 27/14621 257/432 |

OTHER PUBLICATIONS

E. Fred Schubert, Light-Emitting Diodes (Cambridge University Press, 2006), pp. 170-173 and 176-180.*

TW Patent Application No. 104122069—Taiwanese Office Action and Search Report, dated Jun. 1, 2016, with English Translation, 7 pages.

* cited by examiner

HIGH NEAR INFRARED SENSITIVITY IMAGE SENSOR

BACKGROUND INFORMATION

Field of the Disclosure

The present invention is generally related to image sensors, and more specifically, the present invention is directed to image sensors having sensitivity to near infrared light.

Background

Image sensors have become ubiquitous. They are widely used in digital still cameras, cellular phones, security cameras, as well as, medical, automobile, and other applications. The technology used to manufacture image sensors, and in particular, complementary metal-oxide-semiconductor (CMOS) image sensors (CIS), has continued to advance at a great pace. For example, the demands for higher resolution and lower power consumption have encouraged the further miniaturization and integration of these image sensors.

Two fields of applications in which size and image quality are particularly important are security and automotive applications. For these applications the image sensor chip must typically provide a high quality image in the visible light spectrum as well as have improved sensitivity in the infrared and/or near infrared portions of the light spectrum.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
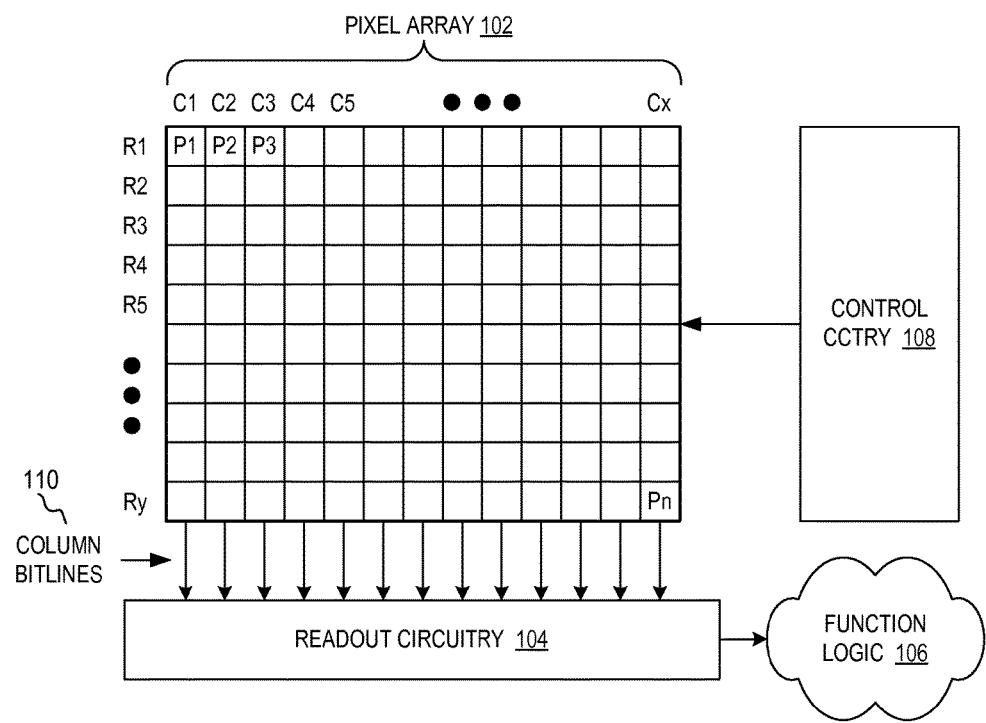
FIG. 1 is a diagram illustrating one example of an imaging system including an example image sensor including an example pixel array having high near infrared sensitivity in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment", "an embodiment", "one example" or "an example" means that a particular feature, structure or characteristic described in connection with the embodiment or example is included in at least one embodiment of the present invention. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or subcombinations in one or more embodiments or examples. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

In a typical image sensor, infrared or near infrared light, such as for example light having a wavelength of for example 850 nm or 940 nm, a nontrivial portion of the incident light enters the semiconductor material, such as for example silicon, and propagates through the semiconductor material without being absorbed. Thus, thicker silicon is needed in order to absorb more of the incident infrared or near infrared light. However, as pixel cell sizes continue to decrease, it has become increasingly challenging to control both optical and electrical crosstalk in thick silicon.

Thus, as will be describe below, an example image sensor in accordance with the teaching of the present invention features a pixel array having a buried multi-layer dielectric reflector that is tuned to reflect near infrared light at a user defined wavelength, such as for example 850 nm or 940 nm. Thus, infrared or near infrared light that penetrates the semiconductor layer and reaches the buried multi-layer dielectric reflector at near normal incidence is reflected, which effectively doubles the thickness of the absorbing semiconductor layer. In addition, the buried multi-layer dielectric reflector is also tuned such that light that reaches the buried multi-layer dielectric reflector at larger angles of incidence is not reflected, which reduces cross-talk in the image sensor in accordance with the teachings of the present invention.

FIG. 1 is a diagram illustrating one example of an imaging system 100 including an example image sensor including an example pixel array having high near infrared sensitivity in accordance with the teachings of the present invention. As shown in the depicted example, imaging system 100 includes a pixel array 102, readout circuitry 104, function logic 106, and control circuitry 108. Pixel array 102 is a two-dimensional (2D) array of imaging sensors or pixel cells (e.g., pixels P1, P2 . . . , Pn). In one example, each pixel cell is a complementary metal-oxide-semiconductor (CMOS) imaging pixel. As illustrated, each pixel cell is arranged into a row (e.g., rows R1 to Ry) and a column (e.g., column C1 to Cx) to acquire image data of a person, place, object, etc., which can then be used to render a 2D image of the person, place, or object, etc.

In one example, after each pixel cell has accumulated its image data or image charge, the image data is readout by readout circuitry 104 through column bitlines 110 and then transferred to function logic 106. In various examples, readout circuitry 104 may also include additional amplification circuitry, additional analog-to-digital (ADC) conversion circuitry, or otherwise. Function logic 106 may simply store the image data or even manipulate the image data by applying post image effects (e.g., crop, rotate, remove red eye, adjust brightness, adjust contrast, or otherwise). In one example, readout circuitry 104 may readout a row of image data at a time along readout column bitlines 110 (illustrated) or may readout the image data using a variety of other techniques (not illustrated), such as a serial readout or a full parallel readout of all pixel cells simultaneously.

In one example, control circuitry 108 is coupled to pixel array 102 to control operational characteristics of pixel array 102. For example, control circuitry 108 may generate a shutter signal for controlling image acquisition. In one example, the shutter signal is a global shutter signal for simultaneously enabling all pixel cells within pixel array 102 to simultaneously capture their respective image data during a single acquisition window. In another example, the shutter signal is a rolling shutter signal such that each row, column, or group of pixels is sequentially enabled during consecutive acquisition windows.

Figure 2:
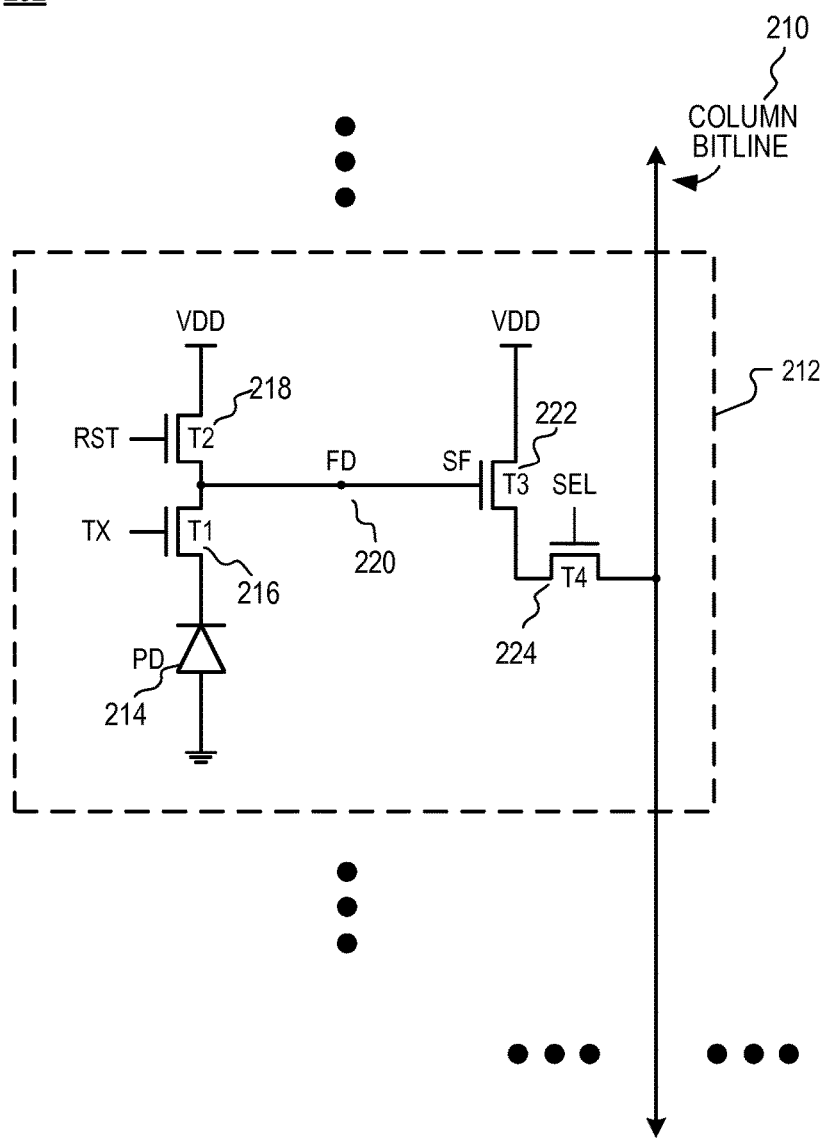
FIG. 2 is a schematic illustrating one example of pixel cell having high near infrared sensitivity in accordance with the teachings of the present invention.

FIG. 2 is a schematic illustrating one example of pixel cell 212 having high near infrared sensitivity in accordance with the teachings of the present invention. In the depicted example, pixel cell 212 is illustrated as being a four-transistor (4T) pixel cell included in image sensor 202 in accordance with the teachings of the invention. It is appreciated that pixel cell 212 is one possible example of pixel circuitry architecture for implementing each pixel cell within the pixel array 102 of imaging system 100 of FIG. 1. However, it should be appreciated that other examples in accordance with the teachings of the present invention are not necessarily limited to 4T pixel architectures. One having ordinary skill in the art having the benefit of the present disclosure will understand that the present teachings are also applicable to 3T designs, 5T designs, and various other pixel architectures in accordance with the teachings of the present invention.

In the example depicted in FIG. 2, pixel cell 212 includes a photodiode (PD) 214 to accumulate image charge, a transfer transistor T1 216, a reset transistor T2 218, a floating diffusion (FD) 220, a source-follower (SF) transistor T3 222, and a row select transistor T4 224. During operation, transfer transistor T1 216 receives a transfer signal TX, which transfers the image charge accumulated in photodiode PD 214 to floating diffusion FD 220. In one example, floating diffusion FD 220 may be coupled to a storage capacitor for temporarily storing image charges. In one example and as will be discussed in further detail below, a buried multi-layer dielectric reflector is formed below photodiode PD 214 in the semiconductor layer in which photodiode PD 214 is disposed to reflect near infrared light within the semiconductor material back to photodiode PD 214, which in effect doubles the thickness of the semiconductor material in accordance with the teachings of the present invention. As such, improved infrared or near infrared sensitivity is provided in accordance with the teachings of the present invention.

As shown in the illustrated example, reset transistor T2 218 is coupled between a power rail VDD and the floating diffusion FD 220 to reset the pixel cell 212 (e.g., discharge or charge the floating diffusion FD 220 and the photodiode PD 214 to a preset voltage) in response to a reset signal RST. The floating diffusion FD 220 is coupled to control the gate of SF transistor T3 222. SF transistor T3 222 is coupled between the power rail VDD and row select transistor T4 224. SF transistor T3 222 operates as a source-follower amplifier providing a high impedance connection to the floating diffusion FD 220. Row select transistor T4 224 selectively couples the output of pixel cell 212 to the readout column bitline 210 in response to a select signal SEL.

In one example, the TX signal, the RST signal, and the SEL signal, may be generated by control circuitry, such as for example control circuitry 108 discussed above in FIG. 1. In an example in which image sensor 202 operates with a global shutter, the global shutter signal is coupled to the gate of each transfer transistor T1 216 in the image sensor 202 to simultaneously commence charge transfer from each pixel's photodiode PD 214. Alternatively, rolling shutter signals may be applied to groups of transfer transistors T1 216 in accordance with the teachings of the present invention.

Figure 3:
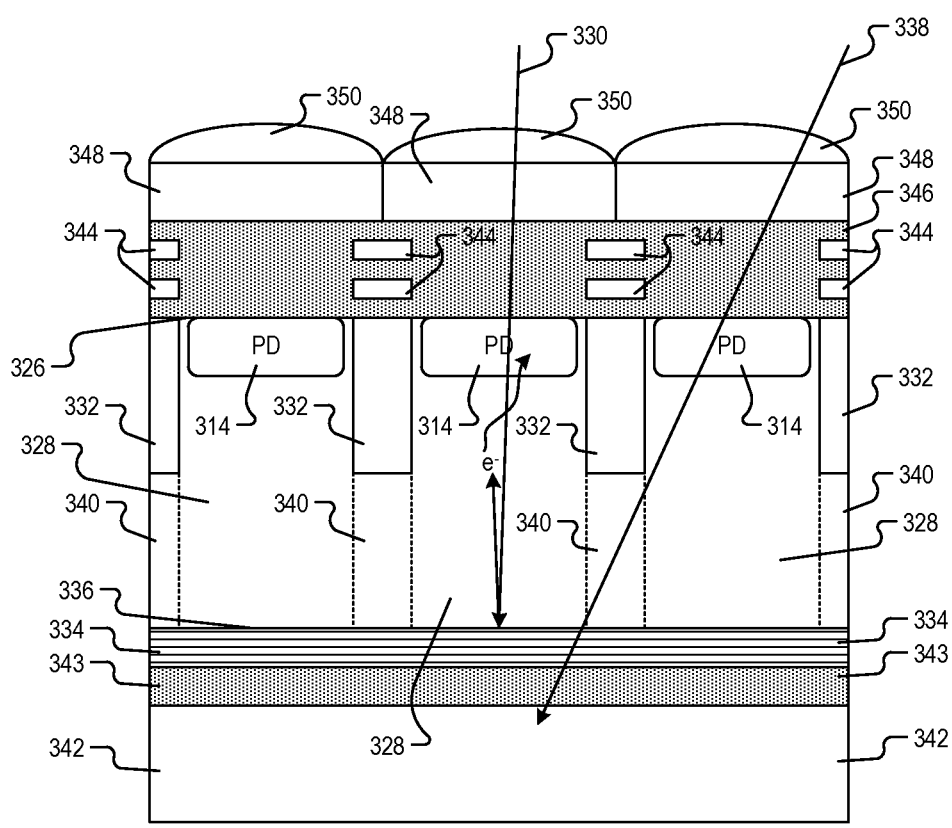
FIG. 3 is a cross-section view illustrating a portion of an example pixel array having high near infrared sensitivity in accordance with the teachings of the present invention.

FIG. 3 is a cross-section view illustrating a portion of an example image sensor 302 having high near infrared sensitivity in accordance with the teachings of the present invention. As shown in the depicted example, image sensor 302 includes a plurality of photodiodes 314 disposed proximate to a frontside 326 of a first semiconductor layer 328 to accumulate image charge in response to light 330 directed into the frontside 326 of the first semiconductor layer 328 at near normal incidence as shown. In one example, first semiconductor layer 328 includes silicon or another suitable semiconductor material that is included in a first semiconductor wafer. Image sensor 302 also includes a plurality of pinning wells 332 disposed in the first semiconductor layer 328. As shown in the example, the plurality of pinning wells 332 separate individual photodiodes 314.

A plurality of dielectric layers 334 is disposed proximate to a backside 336 of the first semiconductor layer 328. In the example, the plurality of dielectric layers 334 form a multi-layer dielectric reflector having dielectric layers that are tuned such that light having a wavelength substantially equal to a user-defined wavelength that is directed to the plurality of dielectric layers 334 at near normal incidence is reflected in accordance with the teachings of the present invention. In one example, the user-defined wavelength may be near infrared wavelengths such as for example 850 nm or 940 nm. To illustrate, the example shown in FIG. 3 illustrates light 330 including light having a wavelength of 850 nm or 940 nm directed to the plurality of dielectric layers 334 at near normal incidence. In other words, light having wavelength of for example 850 nm or 940 nm that is directed to the plurality of dielectric layers 334 with an angle of incidence that is less than a threshold angle is reflected. As shown, the light having the wavelength of 850 nm or 940 nm is reflected from the plurality of dielectric layers 334 back to a respective one of the plurality of photodiodes 314 disposed proximate to the frontside 326 of the first semiconductor layer 328 in accordance with the teachings of the present invention.

In one example, the plurality of dielectric layers 334 form the multi-layer dielectric reflector having dielectric layers that are also tuned such that light that reaches the plurality of dielectric layers 334 at larger incidence angles is not reflected in accordance with the teachings of the present invention. In other words, light that is directed to the plurality of dielectric layers 334 with an angle of incidence that is greater than a threshold angle is not reflected. To illustrate, the example shown in FIG. 3 illustrates light 338 that reaches the plurality of dielectric layers 334 having a larger angle of incidence that is greater than a threshold angle. As a result, light 338 is not reflected from the plurality of dielectric layers 334, and instead passes through the plurality of dielectric layers 334. Accordingly, cross-talk resulting from light 338 being absorbed by a photodiode 314 of a neighboring pixel cell is reduced in accordance with the teachings of the present invention.

The example depicted in FIG. 3 also illustrates an optional plurality of buried deep pinning wells 340 that are disposed in the first semiconductor layer 328. As will be discussed in further detail below, the optional plurality of buried deep pinning wells 340 may be implanted and annealed in the backside 336 of the first semiconductor layer 328 during manufacture prior to the deposition of the plurality of dielectric layers 334 on the backside 336 of the first semiconductor layer 328. The plurality of pinning wells 332 in combination with the plurality of buried deep pinning wells 340 separate the individual photodiodes 314. As shown in the depicted example, the plurality of pinning wells 332 in combination with the plurality of buried deep pinning wells 340 extend through the first semiconductor layer 328 from the frontside 326 to the backside 336 of the first semiconductor layer 328.

The example illustrated in FIG. 3 also shows that image sensor 302 includes a second semiconductor layer 342 that is bonded and annealed to the backside 336 of the first semiconductor layer 328 with a bonding oxide 343 disposed between the backside 336 of the first semiconductor layer 328 and the second semiconductor layer 342 as shown. In one example, second semiconductor layer 342 includes silicon or another suitable semiconductor material that is included in a carrier wafer that is bonded to the wafer of the first semiconductor layer 328. As will be discussed in further detail below, the second semiconductor layer 342 may be bonded and annealed to the backside 336 of the first semiconductor layer 328 with bonding oxide 343 during manufacture after the plurality of dielectric layers 334 are deposited on the backside 336, and before the first semiconductor layer 328 is thinned and polished.

The example illustrated in FIG. 3 further shows that image sensor 302 also includes one or more metal layers 344 and an interlayer dielectric 346 that are disposed proximate to the frontside 326 of the first semiconductor layer 328. A color filter array 348 is disposed proximate to the frontside 326 of the first semiconductor layer 328, and a plurality of microlenses 350 is disposed proximate to the frontside 326 of the first semiconductor layer 328 such that light 330 that is directed into the frontside 326 of the first semiconductor layer 328 is directed through the plurality of microlenses 350, and through the color filter array 348 into the plurality of photodiodes 314 as shown in accordance with the teachings of the present invention.

Figure 4:
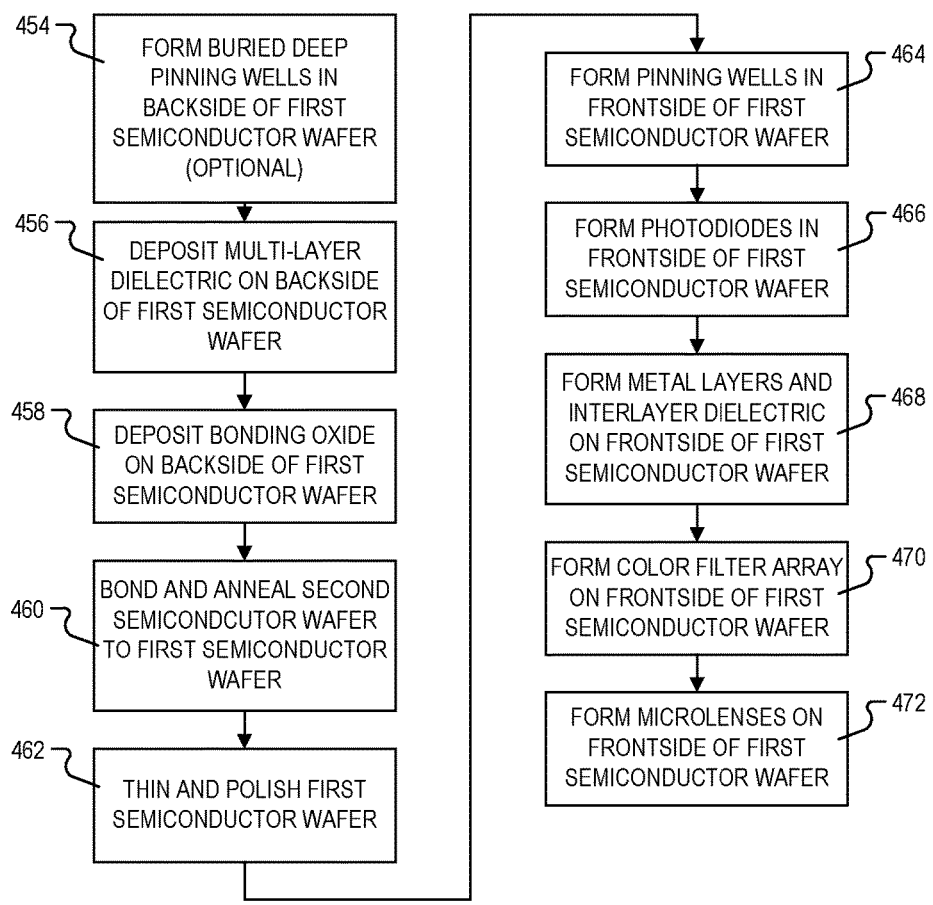
FIG. 4 is a flow diagram illustrating one example of a method of manufacturing a pixel array having high near infrared sensitivity in accordance with the teachings of the present invention.

FIG. 4 is a flow diagram 452 illustrating one example of a method of manufacturing a pixel array having high near infrared sensitivity in accordance with the teachings of the present invention. As shown in the example, an optional process block 454 may be performed in which buried deep pinning wells may be formed in the backside of a first semiconductor wafer. For instance, these buried deep pinning wells may be an example of the optional buried deep pinning wells 340, which are illustrated in FIG. 3 as being implanted and annealed in the backside 336 of the first semiconductor layer 328.

Process block 456 shows that a multi-layer dielectric reflector may then be deposited on the backside of the first semiconductor wafer. For instance, this multi-layer dielectric reflector may be an example of the plurality of dielectric layers 334 illustrated in FIG. 3.

Process block 458 shows that a bonding oxide may then be deposited on the backside of the first semiconductor wafer and then process block 460 shows that a second semiconductor wafer may then be bonded and annealed to the first semiconductor wafer. For instance, the bonding oxide and the second semiconductor wafer may be examples of the bonding oxide 343 and second semiconductor layer 342, which are bonded and annealed to the backside 336 of the first semiconductor layer 328 as shown in FIG. 3.

Process block 462 shows that the first semiconductor wafer may then be thinned to a desired thickness and then polished. For instance, the first semiconductor wafer may be the first semiconductor layer 328 illustrated in FIG. 3. In the example, before frontside illuminated (FSI) sensor fabrication, the first semiconductor layer 328 is thinned to a desired thickness, and then the thinned surface of the first semiconductor layer 328 may then be polished to prepare the first semiconductor layer 328 for FSI sensor fabrication.

Process block 464 shows that pinning wells may then be formed in the frontside of the first semiconductor wafer. For instance, these pinning wells may be an example of the plurality of pinning wells 332 illustrated in FIG. 3.

Process block 466 shows that photodiodes may then be formed in the frontside of the first semiconductor wafer. For instance, these diodes may be an example of the plurality of photodiodes 314 illustrated in FIG. 3.

Process block 468 shows that metal layers and an interlayer dielectric may then be formed proximate to the frontside of the first semiconductor wafer. For instance, these metal layers and an interlayer dielectric may be examples of the one or more metal layers 344 and interlayer dielectric 346 illustrated in FIG. 3.

Process block 470 shows that a color filter array may then be formed proximate to the frontside of the first semiconductor wafer. For instance, this color filter array may be an example of color filter array 348 illustrated in FIG. 3.

Process block 472 shows that a plurality of microlenses may then be formed proximate to the frontside of the first semiconductor wafer. For instance, this plurality of microlenses may be an example of the plurality of microlenses 350 illustrated in FIG. 3.

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention.

These modifications can be made to examples of the invention in light of the above detailed description. The terms used in the following claims should not be construed to limit the invention to the specific embodiments disclosed in the specification and the claims. Rather, the scope is to be determined entirely by the following claims, which are to be construed in accordance with established doctrines of claim interpretation. The present specification and figures are accordingly to be regarded as illustrative rather than restrictive.

What is claimed is:

1. A method of fabricating an image sensor, comprising:
   depositing a plurality of dielectric layers directly on a backside of a first semiconductor layer, wherein the plurality of dielectric layers are tuned to reflect light having a wavelength substantially equal to a first wavelength;
   depositing a bonding oxide on the backside of the first semiconductor layer, after depositing the plurality of dielectric layers, so that the plurality of dielectric layers are disposed between the bonding oxide and the first semiconductor material;

bonding and annealing a second semiconductor layer to the bonding oxide on the backside of the first semiconductor layer after depositing the bonding oxide;

thinning the first semiconductor layer after bonding and annealing the second semiconductor layer to the bonding oxide;

forming a plurality of pinning wells in the first semiconductor layer proximate to a frontside of the first semiconductor layer, opposite the plurality of dielectric layers, after thinning the first semiconductor layer;

forming a plurality of photodiodes in the first semiconductor layer proximate to the frontside of the first semiconductor layer after forming the plurality of pinning wells, wherein the plurality of pinning wells separate individual photodiodes included in the plurality of photodiodes, wherein the light having the wavelength substantially equal to the first wavelength included in the light directed into the frontside of the first semiconductor layer is reflected from the plurality of dielectric layers back to a respective one of the plurality of photodiodes disposed proximate to the frontside of the first semiconductor layer, and wherein each of the plurality of dielectric layers is laterally coextensive with at least two adjacent photodiodes in the plurality of photodiodes.

2. The method of claim 1, further comprising implanting and annealing a plurality of buried deep pinning wells proximate to the backside of the first semiconductor layer prior to depositing the plurality of dielectric layers on the backside of the first semiconductor layer, wherein the plurality of buried deep pinning wells in combination with the plurality of pinning wells separate the individual photodiodes included in the plurality of photodiodes.

3. The method of claim 2, wherein the plurality of buried deep pinning wells in combination with the plurality of pinning wells extend through the first semiconductor layer from the frontside of the first semiconductor layer to the backside of the first semiconductor layer.

4. The method of claim 1, further comprising tuning the plurality of dielectric layers such that the light directed into the frontside of the first semiconductor layer that reaches the plurality of dielectric layers having an angle of incidence less than a first angle is reflected from the plurality of dielectric layers.

5. The method of claim 1, further comprising tuning the plurality of dielectric layers such that the light directed into the frontside of the first semiconductor layer that reaches the plurality of dielectric layers having an angle of incidence greater than a first angle is not reflected from the plurality of dielectric layers.

6. The method of claim 1, further comprising polishing the frontside of the first semiconductor layer after thinning the first semiconductor layer.

7. The method of claim 4, further comprising forming a metal layer disposed proximate to an interlayer dielectric formed proximate to the frontside of the first semiconductor layer.

8. The method of claim 7, further comprising forming a color filter array so that the interlayer dielectric is disposed between the color filter array and the frontside of the first semiconductor layer such that the light directed into the frontside of the first semiconductor layer is directed through the color filter array and through the interlayer dielectric, past the metal layer disposed in the interlayer dielectric, to the frontside of the first semiconductor layer, and wherein the light directed into the frontside of the first semiconductor layer that reaches the plurality of dielectric layers having an angle of incidence less than a first angle is reflected from the plurality of dielectric layers.

9. The method of claim 1, further comprising forming a plurality of microlenses proximate to the frontside of the first semiconductor layer such that the light directed into the frontside of the first semiconductor layer is directed through the plurality of microlenses to the frontside of the first semiconductor layer.

10. The method of claim 1, wherein the first wavelength is one of 850 nm or 940 nm.

* * * * *